(12) United States Patent
Hwangbo et al.

(10) Patent No.: US 6,613,683 B2
(45) Date of Patent: Sep. 2, 2003

(54) METHOD OF MANUFACTURING A CONTACT HOLE OF A SEMICONDUCTOR DEVICE

(75) Inventors: Young Hwangbo, Gyeonggi-do (KR); Dong-Yun Kim, Gyeonggi-do (KR); Hyuck-Jun Lee, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/915,520

(22) Filed: Jul. 27, 2001

(65) Prior Publication Data

US 2002/0016077 A1 Feb. 7, 2002

(30) Foreign Application Priority Data

Jul. 28, 2000 (KR) .......................................... 2000-43762

(51) Int. Cl.⁷ .............................................. H01L 21/302
(52) U.S. Cl. ........................ 438/706; 438/710; 438/712; 438/720
(58) Field of Search ................................. 438/706, 710, 438/712, 713, 720, 723, 724; 156/325

(56) References Cited

U.S. PATENT DOCUMENTS 5,242,532 A * 9/1993 Cain .......................... 156/345
6,066,566 A * 5/2000 Naeem et al. .............. 438/700
6,281,132 B1 * 8/2001 Nguyen et al. ............. 438/706

FOREIGN PATENT DOCUMENTS

| JP | 3-183162 | 8/1991 |
| JP | 4-32227 | 2/1992 |

* cited by examiner

Primary Examiner—Robert Kunemund
Assistant Examiner—Lan Vinh
(74) Attorney, Agent, or Firm—Volentine Francos, PLLC

(57) ABSTRACT

A spacer is formed on a side wall of a gate electrode formed over a substrate, and a dielectric interlayer is then formed over the substrate, the gate electrode and the spacer. A region of the dielectric interlayer is then subjected to a first etching process using an etching gas. An emission amount of a chemical compound emitted during the first etching process is detected, where the chemical compound is produced by a chemical reaction of the etching gas and the spacer. The region of the dielectric interlayer is then subjected to a second etching process upon detecting that the emission amount of the chemical compound has reached a given level. The second etching process may be continued until a contact hole is defined in the dielectric interlayer.

13 Claims, 8 Drawing Sheets

FIG. 5D
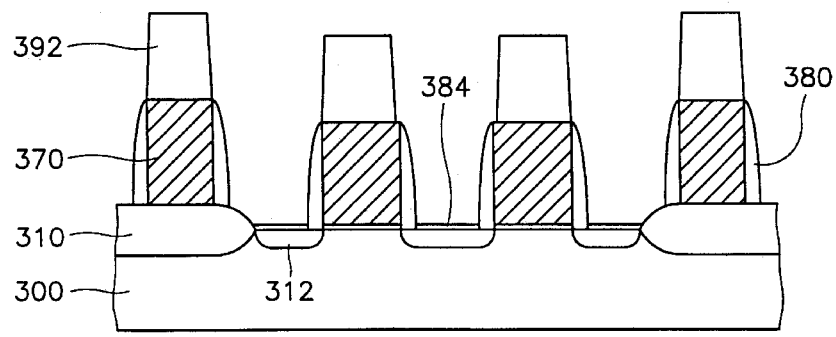
FIG. 5E
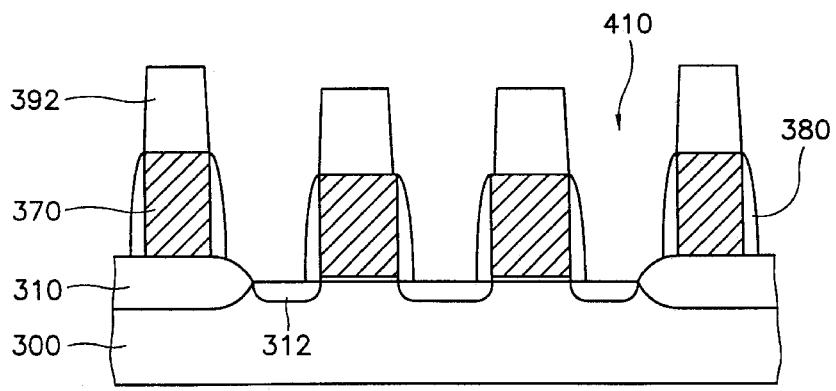

METHOD OF MANUFACTURING A CONTACT HOLE OF A SEMICONDUCTOR DEVICE

BACKGROUND OF THE INVENTION

1. Field of the Invention

The present invention generally relates to a method of manufacturing a contact hole of a semiconductor device, and more particularly, the present invention relates to a method of manufacturing a contact hole of a semiconductor device in which an entire etching process can be advantageously controlled by setting a first etch point according to a CN (carbon—nitrogen) emission spectrum originated from a spacer during the etching process.

2. Description of the Related Art

In initially developed VLSI (very large scale integration) devices, polysilicon gates were typically adopted due to their favorable electrical characteristics, reliability, integration degree and the like.

Since polysilicon is a material having a high melting point, a self-align method can be applied in which source and drain diffusion regions are simultaneously formed during the manufacture of the gate electrode. In addition, polysilicon can be thermally oxidized after being patterned as the polysilicon gate electrode. Accordingly, damage generated at the edge portions of the gate electrodes by a reactive ion etching can be contained, and device reliability can be increased by relaxing the high fringe electric field at the edge portions when an electric potential is applied to the gate electrode.

However, for devices having a polysilicon gate and a design rule of 1 $\mu$m or less, an increased operational speed for the device which typically results from integration is eliminated. In addition, a problem of retarding signal transfer occurs due to an increase in a wire resistance of the minute device and an increase in capacitance through a reduction of a wiring pitch. Further, since polysilicon has a relatively large resistance when compared with other conductive materials, a frequency characteristic of the device is deteriorated.

Therefore, silicide compounds having a high melting point have recently been utilized as a gate electrode material. The silicide compounds have characteristics similar to polysilicon and have a lower resistance by one-tenth or less. Typically, tungsten silicide is utilized as the silicide compound.

Recently developed high-integrated semiconductor devices have a design rule as small as about 0.15 $\mu$m. Accordingly, the size of a contact hole, which is an electric contacting portion with silicon, has been gradually reduced, and the BC processing margin for an interconnection of a storage node with source/drain regions of a transistor has been further limited.

Presently, a self-align method is utilized for confirming the BC processing margin and a spacer is formed at side surfaces of a gate electrode for preventing a connection of the gate electrode with the storage node. However, confirmation of the BC processing margin is still a serious problem. Likewise, it is important to confirm the thickness of the spacer formed on the side surface of the gate electrode, that is, the shoulder margin.

FIGS. 1A through 1E are cross-sectional views for explaining a conventional method of manufacturing a contact hole of a semiconductor device.

Referring to FIG. 1A, a first oxide layer 120 is formed by a local oxidation of silicon (LOCOS) method on an active region on a semiconductor substrate 100. The active region is defined between field regions, which in turn are defined by field oxide layers 110 having a thickness of about 1800–2000 Å. Then, a first conductive layer 130 is formed on the first oxide layer 120 by depositing a conductive material to a thickness of about 800–1200 Å. The conductive material of the first conductive layer 130 may be formed of an impurity-doped conductive polysilicon.

Next, a second conductive layer 140 is formed on the first conductive layer 130. The second conductive layer 140 is formed by depositing a metal-silicide such as tungsten silicide ($WSi_x$), tantalum suicide ($TaSi_2$), molybdenum silicide ($MoSi_2$), etc. to a thickness of about 1300–1700 Å.

A first insulating layer 150 is formed on the second conductive layer 140. The first insulating layer 150 is formed by depositing a nitride compound such as silicon nitride (SiN) to a predetermined thickness by a plasma enhanced chemical vapor deposition method. The first insulating layer 150 passivates (protects) the second conductive layer 140 during an etching process and an ion implantation process implemented afterward.

Then, a second oxide layer 160 is formed on the first insulating layer 150. The second oxide layer 160 is formed by depositing a hot temperature oxide (HTO) such as silicon oxide to a predetermined thickness by a low pressure chemical vapor deposition method. The second oxide layer 160 functions as an etching stopper during an etching process implemented afterward.

Referring to FIG. 1B, a photoresist pattern is formed by coating photoresist on the second oxide layer 160 to form a photoresist layer (not shown) and then by patterning the photoresist using photolithography techniques. The photoresist pattern (not shown) is used to define later-formed gate electrodes.

Then, the second oxide layer 160, the first insulating layer 150, the second conductive layer 140, the first conductive layer 130 and the first oxide layer 120 are subsequently and anisotropically etched by utilizing the photoresist pattern as an etching mask to form a gate electrode 170. The gate electrode 170 include a gate oxide layer 122, a first conductive pattern 132, a second conductive pattern 142, a first insulating layer pattern 152 and a second oxide layer pattern 162.

Referring to FIG. 1C, a second insulating layer (not shown) is formed on the semiconductor substrate 100 (on which the gate electrode 170 is formed) by depositing silicon nitride. Then, an etch back process is implemented until the active region of the semiconductor substrate 100 is exposed to thereby form spacers 180 on the side of the gate electrode 170. At this time, the second oxide layer pattern 162 formed from the high temperature oxide functions as an etching stopper during the etch back of the second insulating layer.

Next, an ion implantation process is implemented to implant impurities into the exposed active region of the semiconductor substrate 100 to form a diffusion region 112 of a source/drain region of a transistor. During the ion implantation process, the spacers 180 formed on both side portions of the gate electrode 170 function as a mask.

Referring to FIG. 1D, a dielectric interlayer 190 is formed on the semiconductor substrate 100 on which the gate electrode 170 and the spacers 180 are formed. The dielectric interlayer 190 is formed by depositing silicon oxide, BPSG, PSG, or the like, using a low pressure chemical vapor deposition method or plasma enhanced chemical vapor deposition method. Subsequently, a photoresist pattern 200 is formed by coating photoresist on the dielectric interlayer 190 and by patterning the photoresist using conventional photolithography techniques. The photoresist pattern 200 defines contact holes to be formed later.

Referring to FIG. 1E, the dielectric interlayer 190 is etched by utilizing the photoresist pattern 200 as an etching mask to expose the source/drain region 112 on the semiconductor substrate 100, thereby forming a contact hole 210 and a dielectric interlayer pattern 192. The etching of the dielectric interlayer layer is implemented using etching equipment having a high ionization degree such as ICP, TCP, SWP, DRM, etc., and by utilizing a mixture gas having a high ratio of carbon/fluorine such as $C_3F_8$, $C_4F_8$, CO, etc.

Then, a conductive material is deposited onto the substrate 100 (on which the dielectric interlayer pattern 192 including the contact hole 210 is formed) to form a contact or a storage node (not shown).

The above-described method of forming a contact hole suffers a drawback as will be explained below with reference to FIG. 2.

In order to manufacture a semiconductor device, various layers of metals, oxides, polysilicon, etc., are subsequently integrated on a semiconductor substrate. Then, a photoresist pattern is formed on the upper most layer, and a dry etching process utilizing plasma is implemented to dry etch the exposed portion of the upper most layer.

The etching of the dielectric interlayer for the formation of the contact hole is implemented using equipment having a high ionization degree such as ICP, TCP, SWP, DRM, etc., and by utilizing a mixture gas having a high carbon/fluoride ratio such as $C_3F_8$, $C_4F_8$, CO, etc. Generally, the etching ratio of the dielectric interlayer spacer is larger than 8:1. If the etching ratio is increased, the etching might be stopped during the implementation thereof, and if the etching ratio is decreased, a selective etching is not accomplished.

The etching of the dielectric interlayer for forming the contact hole is stopped when the dielectric interlayer designated as the thickness B of FIG. 2 is etched. Generally, the etching is implemented with an optimized time condition. Here, the thickness designated as A, which is obtained by substracting the thickness of the gate electrode 170 from B, is different between wafers and lots. The difference is about 1000 Å. Accordingly, when the etching is implemented with a constant time condition, an excessive over etching or an under etching can occur. As a result, incompletely etched contact hole can be manufactured to thereby increase a failure ratio and deteriorate the quality (or reliability) of the semiconductor device.

Etching methods applied in the manufacture of semiconductor device are classified as either a wet etching method or a dry etching method. Also, the removal of a target material by dry etching is classified in two manners. The target material is removed through a chemical reaction with an active particulate or through a physical impaction. If plasma is generated, the chemical reaction is further activated.

Dry etching consists of a main etching by which the upper most layer is etched to the end point thereof and an over etching by which a specific portion of the upper most layer which has not been completely etched due to a thickness difference is etched. The over etching is implemented after carrying out EPD (end point detection) for measuring the time needed for the main etching by which the upper most layer is etched to the end point.

A specific material formed on the semiconductor substrate is selectively etched through a reaction with plasma. During the etching process, a light having a specific wavelength is emitted. The wavelength of the emitted light is dependent on the kind of the plasma and the material to be etched.

The light having the specific wavelength is utilized to detect the end point of the dry etching. That is, the light emitted by the layer formed under the target layer is detected to end the dry etching process.

However, the thickness of the target layer to be etched is not uniform throughout the whole wafer due to the presence of on or more surface steps, etc., and the etching is not uniformly implemented throughout the whole wafer. Accordingly, sufficient time is needed to completely etch the desired portion of the target layer.

However, because the etchant utilized for the plasma etching also has a selectivity ratio as for the case of the wet etching, a long-lasting etching might undesirably etch the underlying layer after completely etching the target layer. When the etchant having a lower selectivity ratio is used in order to increase the etching efficiency, the above-described phenomenon might occur more frequently.

Therefore, in order to solve the problem, a method of changing the etching condition by detecting a specific point is additionally utilized with the method of implementing the plasma etching during a given time period. That is, the etching is implemented by utilizing the condition by which the etching is rapidly carried out before the specific point, and then, the etching is implemented by utilizing the condition having a high selectivity with respect to the underlying layer even though the etching rate is lowered after the specific point.

At this time, the specific point denotes the time when the underlying layer positioned under the target layer is exposed, and the EPD finds this specific point. Further, the etching implemented before this specific point is called as "main etching" and the etching implemented after this specific point is called as "over etching."

The EPD plays an important role for the etching process implemented through multi-step processes. Various methods are utilized for the EPD. However, the method of detecting an emission generated from plasma by means of a monochromator in a processing chamber is widely used. Through this method, some peaks are detected from a light having a specific wavelength for a target material.

Japanese Patent Laid-open No. Hei 3-183162 discloses a method of forming a contact hole by etching an insulating layer of a three-layered structure of an oxide layer, a nitride layer and an oxide layer on gate electrodes and side walls. In this Patent, the inter layer, that is, the nitride layer is utilized as a detecting layer of the end point of the etching so as to control the etching process.

Japanese Patent Laid-open No. Hei 4-32227 discloses a method of determining an end point of etching for a specific layer by forming a silicon nitride layer under a specific layer and then detecting a CN emitting spectrum generated from the silicon nitride layer during a dry etching.

SUMMARY OF THE INVENTION

It is an objective of the present invention to provide a method of manufacturing a contact hole of a semiconductor device by which an optimized etching condition can be obtained using EPD and a product quality can be improved by applying an optimized etching condition for each wafer.

To accomplish this objective, a method of manufacturing a contact hole of a semiconductor device is provided in which a spacer is formed on a side wall of a gate electrode formed on a substrate, and then a dielectric interlayer is formed thereon. A predetermined region of the dielectric interlayer is etched using an etching gas. Particularly, a first etching is implemented until an emitting amount of a chemical compound produced by the etching gas with the spacer becomes maximum, and then a second etching is implemented until the substrate is exposed.

The objective of the present invention also is accomplished by a method of manufacturing a contact hole of a semiconductor device in which a spacer is formed on a gate electrode formed on a substrate, and then an SiN layer is formed on an exposed portion of the substrate. A dielectric interlayer is formed on the thus obtained substrate. Then, a predetermined region of the dielectric interlayer is etched by using an etching gas. Particularly, a first etching is implemented until an emitting amount of a chemical compound produced by the etching gas with the spacer becomes a maximum, and then a second etching is implemented until the substrate is exposed.

BRIEF DESCRIPTION OF THE DRAWINGS

The above objectives and advantages of the present invention will become more apparent from the detailed description that follows, with reference to the attached drawings, in which:

FIGS. 5A through 5E are cross-sectional views for explaining a method of manufacturing a contact hole according to another embodiment of the present invention.

DETAILED DESCRIPTION OF THE PREFERRED EMBODIMENTS

The present invention will be explained below in more detail with reference to the attached drawings.

Figure 3:
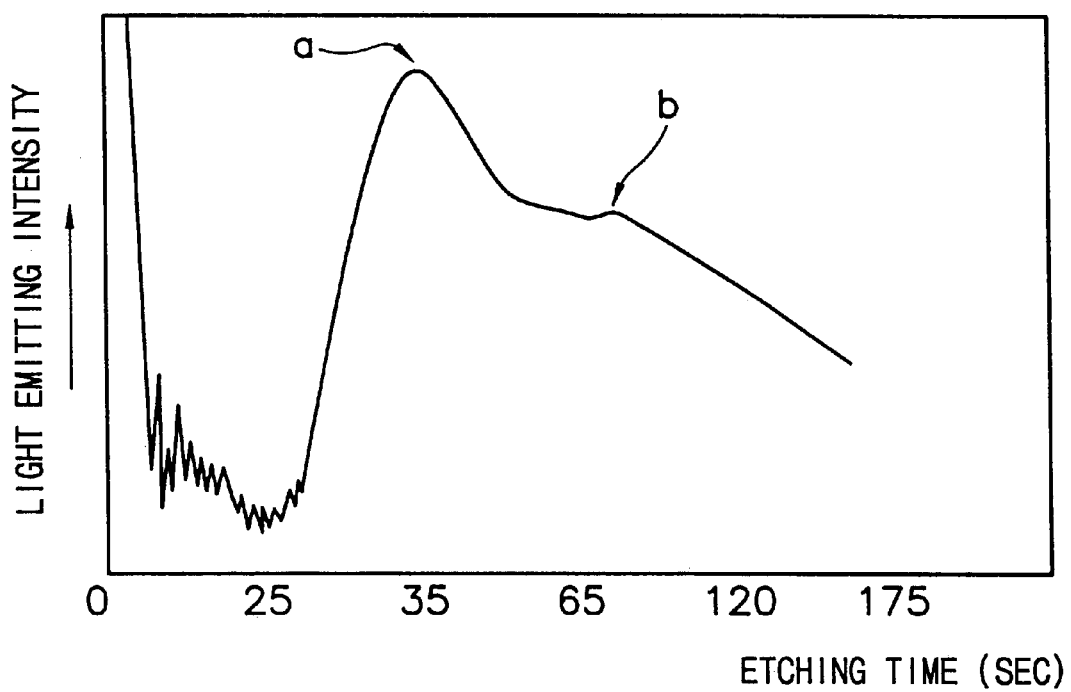
FIG. 3 is a graph obtained by monitoring CN compounds during an etching process for manufacturing a contact hole.

FIG. 3 is a graph obtained by monitoring CN compounds (compounds having a C—N bond) during an etching process for manufacturing a contact hole.

Figure 1A:
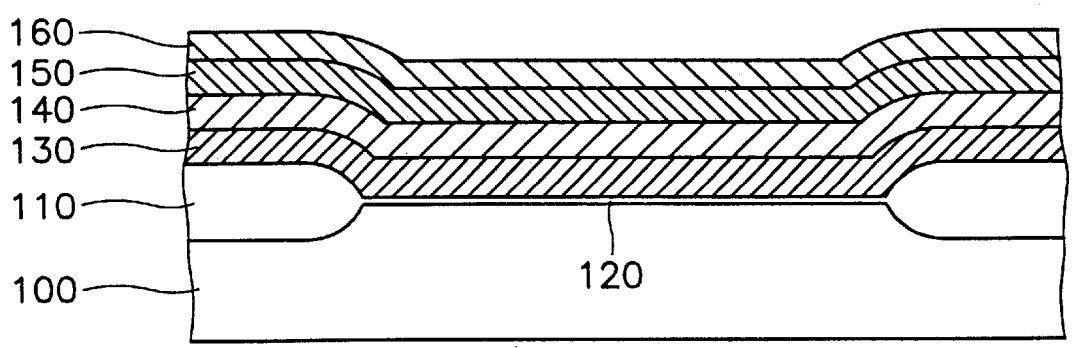
FIGS. 1A through 1E are cross-sectional views for explaining a method of manufacturing a contact hole according to a conventional method.
Figure 1B:
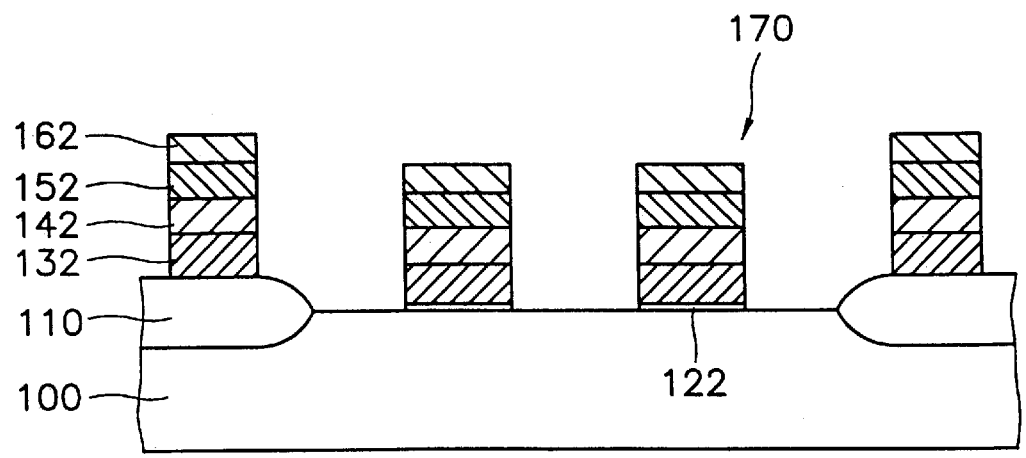
Figure 1C:
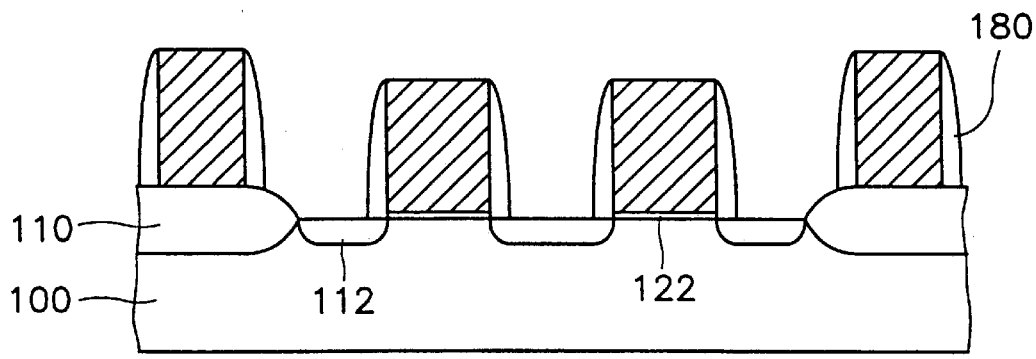
Figure 1D:
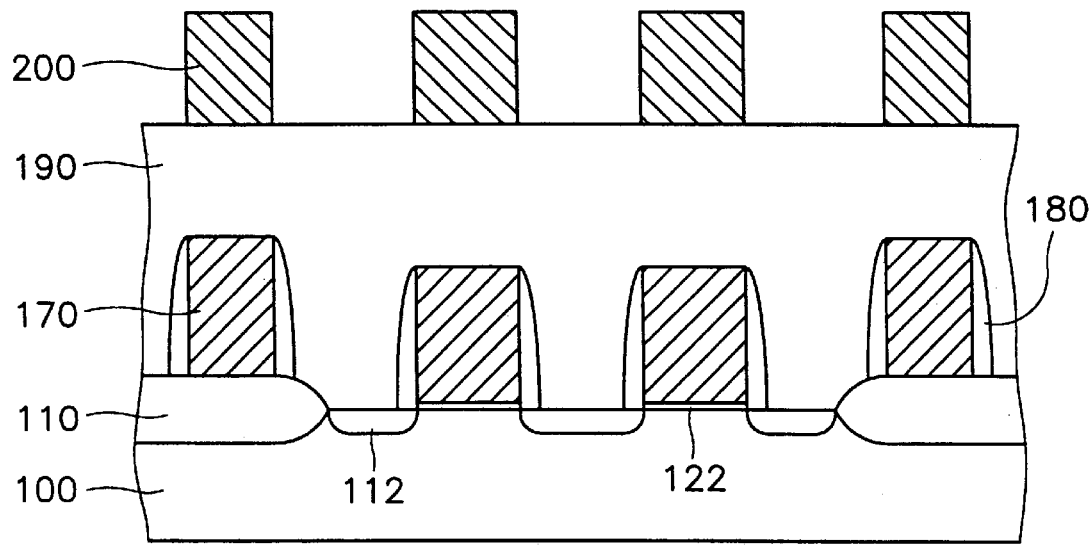
Figure 1E:
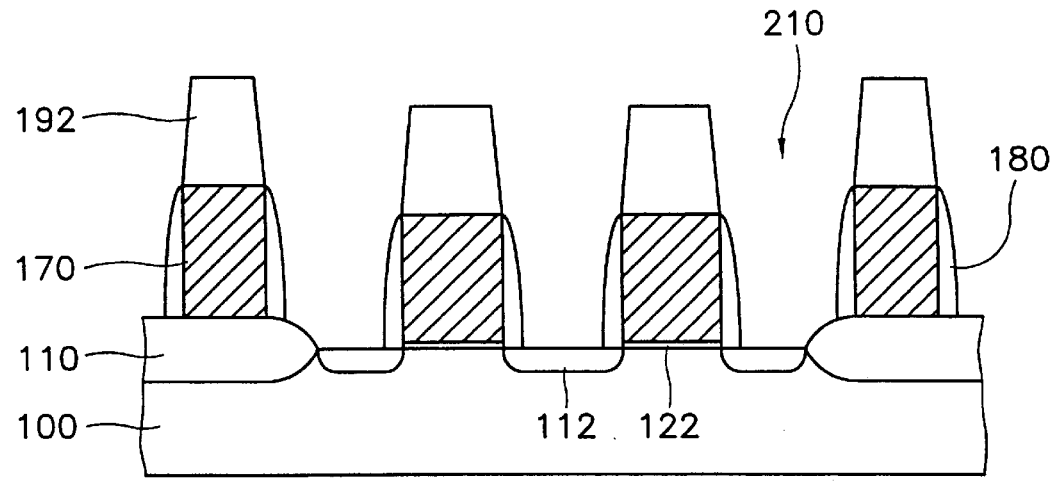
Figure 2:
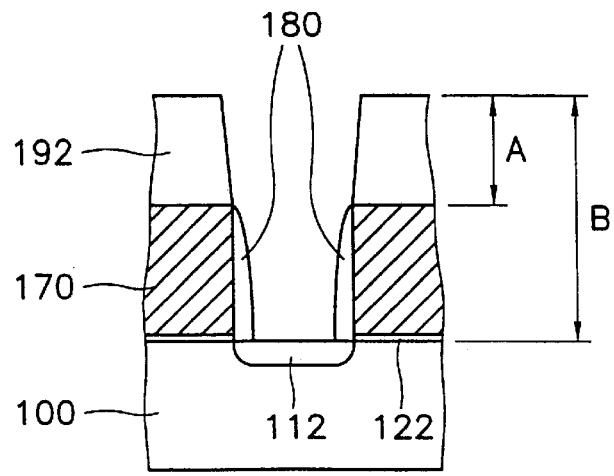
FIG. 2 is a partial cross-sectional view for explaining a problem occurring during the manufacture of the contact hole according to the conventional method.

This graph is obtained by monitoring an emission spectrum of CN compounds over time during etching of a dielectric interlayer to form a contact hole as illustrated in FIG. 2. The emission amount of the CN compounds gradually increases to the maximum point "a" and then decreases while making a second apex at the point "b". The carbon component in the etching gas having a predetermined etching ratio reacts with a nitrogen component contained in the spacer formed at the side wall of the gate electrode to produce a CN compound. The first apex which is the maximum point is obtained immediately after the spacer is exposed.

Accordingly, the point immediately after the exposure of the spacer can be advantageously determined through this graph. As for the dielectric (or insulating) interlayer, the thickness difference from the surface of the dielectric interlayer to the spacer is somewhat large. However, the thickness difference of the dielectric interlayer from the spacer to the surface of the substrate is small. Therefore, if the exposure time of the spacer is determined, the etching after this time can be advantageously controlled by implementing the etching during a given time period.

Figure 4A:
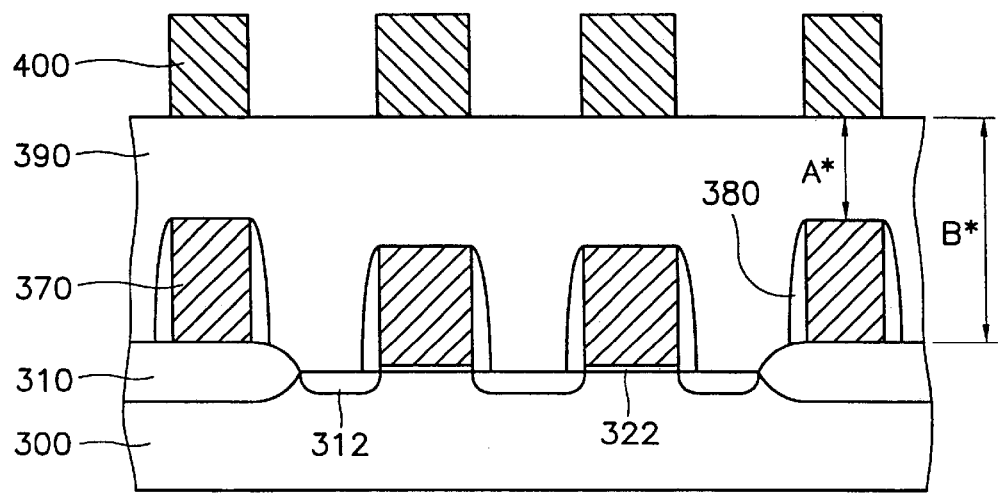
FIGS. 4A through 4C are cross-sectional views for explaining a method of manufacturing a contact hole according to an embodiment of the present invention.
Figure 4B:
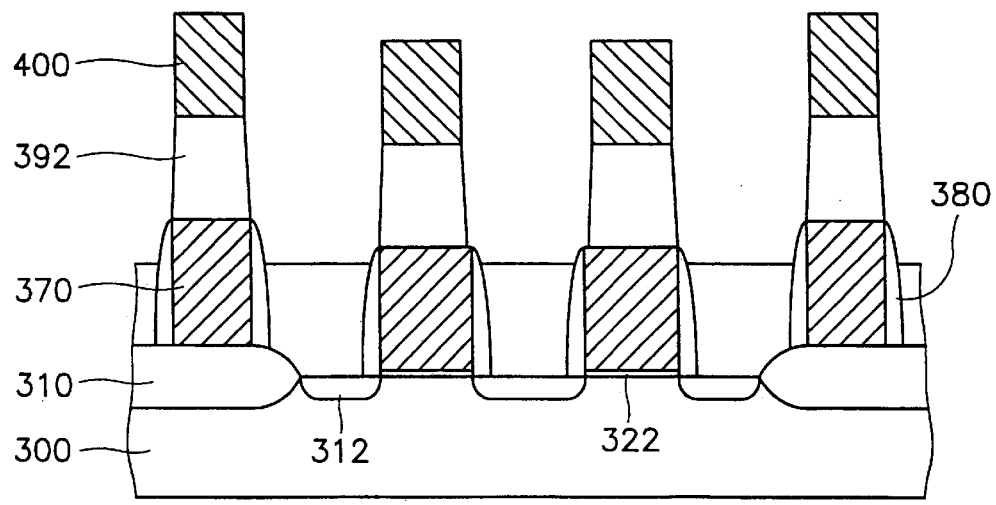
Figure 4C:
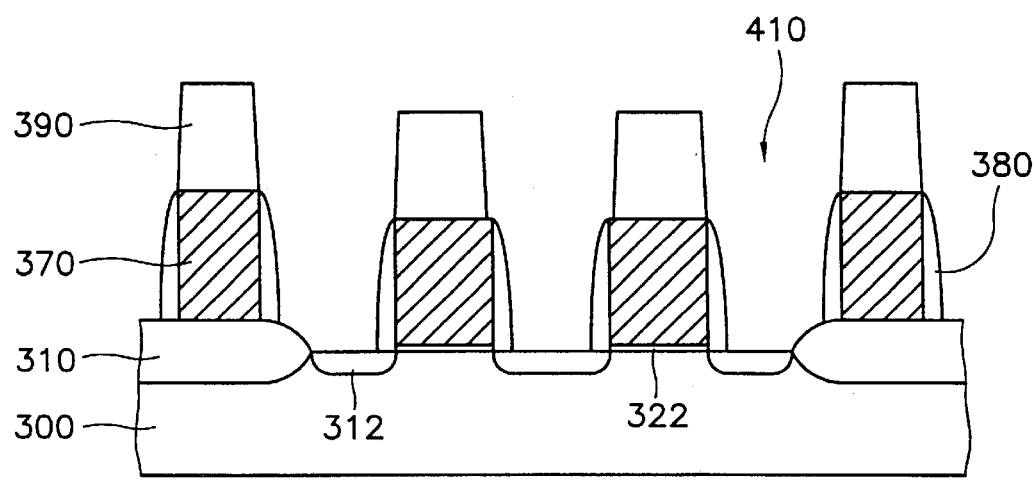

FIGS. 4A through 4C are cross-sectional views for explaining a method of manufacturing a contact hole according to an embodiment of the present invention.

Referring to FIG. 4A, a gate electrode 370 is formed on a semiconductor substrate 300 which is separated into an active region and a field region by a field oxide layer 310 having a thickness of about Å. The gate electrode 370 is formed as follows.

First, sequentially deposited are a gate oxide layer; a first conductive layer fonned by depositing an impurity doped polysilicon to a thickness of about 800–1200 Å; a second conductive layer formed by depositing metal silicide such as tungsten silicide to a thickness of about 130–1700 Å; a first insulating layer formed by depositing silicon nitride (SiN) to a thickness of about 800–1200 Å and formed for passivating the second conductive layer during an etching and ion implantation process implemented afterward; and a second oxide layer formed by depositing HTO to a thickness of about 800–1300 Å.

On the thus obtained second oxide layer, a photoresist pattern is formed by depositing a photoresist and then by patterning the photoresist by photolithography. The photoresist pattern (not shown) is configured to define the gate electrodes.

Then, the second oxide layer, the first insulating layer, the second conductive layer, the first conductive layer and the first oxide layer are subsequently and anisotropically etched by utilizing the photoresist pattern as an etching mask to form a gate electrode including a gate oxide layer pattern, a first conductive pattern, a second conductive pattern, a first insulating layer pattern and a second oxide layer pattern.

A second insulating layer (not shown) is formed on the semiconductor substrate 300 on which the gate electrode 370 is formed by depositing silicon nitride to about 1200 Å. Then, an etch back process is implemented until the active region of the semiconductor substrate 300 is exposed to form a spacer 380 on the side portion of the gate electrode 370.

Next, an ion implantation process is implemented to inject impurities into the exposed active region of the semiconductor substrate 300 to form a diffusion region 312 of a source/drain region of a transistor. During the ion implantation process, the spacer 380 formed on the side portion of the gate electrode 370 functions as a mask. A dielectric interlayer 390 is formed on the semiconductor substrate 300 on which the gate electrode 370 and the spacer 380 are formed. The dielectric interlayer 390 is formed by depositing silicon oxide, BPSG, PSG, etc. to a thickness of about 3000–10000 Å using a low pressure chemical vapor deposition method or a plasma enhanced chemical vapor deposition method. Next, the surface portion of the dielectric interlayer 390 is planarized by using a CMP (chemical mechanical polishing) method for subsequently implementing deposition and patterning processes. Subsequently, a photoresist pattern 400 for exposing a portion which will be a contact hole afterward, is formed by depositing photoresist on the dielectric interlayer 390 and patterning the photoresist by photolithography.

Referring to FIG. 4B, the dielectric interlayer 390 is etched by utilizing the photoresist pattern 400 as an etching mask. The etching of the dielectric interlayer layer is implemented using etching equipment having a high ionization degree such as ICP, TCP, SWP, DRM, etc., and by utilizing a mixture gas having a high ratio of carbon/fluorine such as $C_3F_8$, $C_4F_8$, $C_5F_8$, CO, etc.

The etching equipment for the dry etching includes a coil into which an RF power is applied, a chamber in which a vacuum condition is maintained and plasma is filled, a ceramic window which functions as an insulating plate which insulates the coil and the chamber and also functions as an upper electrode, and a lower electrode into which a bias voltage is applied and which is installed in the chamber so as to support a wafer.

The plasma etching method utilized for the dry etching is classified as a PE (plasma etching), an RIE (reactive ion etching), an MERIE (magnetically enhanced reactive ion etching), an ECR (electron cyclotron resonance), a TCP (transformer coupled plasma), etc., according to the manner of generating the plasma.

In the TCP etching method which utilizes a HDP (high density plasma) source, the coil becomes a plasma source and the plasma is generated by an electric field induced by the coil. By this method, sufficiently uniform plasma can be generated according to the shape and structure of the coil. Accordingly, the impurity doped polysilicon layer can be anisotropically and advantageously etched by controlling an ion density and ion energy with a high selectivity onto the oxide compound with respect to the photoresist material.

In order to implement the plasma etching process using above-described various equipments by various methods, an electric power having a high frequency should be applied into the processing chamber of the equipment, and therefore, an electric voltage having a high frequency is applied into the processing chamber. After applying the electric voltage having a high frequency into the processing chamber, the etching gas is supplied. Then, the etching gas is activated by the electric voltage and a plasma atmosphere is formed in the processing chamber. The material layer to be etched reacts with the activated gas of the plasma state to cause the etching.

At this time, the activated gas of the plasma state emits a discharge light. This discharge light has an intrinsic wavelength. Commonly, an EPD is installed at the processing chamber to sense the change of the wavelength of the discharge light and to determine an end point of the etching. For the plasma etching equipment, the etching amount is automatically controlled to an appropriate amount by utilizing the EPD. In addition, at one side the plasma etching equipment, a window is installed to emit the light from the plasma outward. Further provided are a spectrometer for detecting a light having a specific wavelength among the light emitted outward through the window, a multiplier for transforming the detected light having the specific wavelength into an electric signal, and a detecting portion for determining the end point of the etching by processing the outputted electric signal.

By utilizing the above-described equipment, the emission intensity of the light from the CN compound is continuously monitored during the etching process as shown in FIG. 3, to find the apex designated as "a" and to determine the first end point of the etching. This first end point of the etching is obtained immediately after the spacer is exposed as shown in FIG. 4B. In FIG. 4A, within the thickness of the dielectric interlayer designated as "B*", the partial thickness designated as "A*" differs among wafers and lots. However, the remaining thickness of the dielectric interlayer obtained by extracting A* from B* is almost constant and so, the remaining thickness of the dielectric interlayer as shown in FIG. 4B is considered to be constant. Accordingly, the remaining thickness of the dielectric interlayer can be advantageously etched using the conventional etching method.

Referring to FIG. 4C, the second etching is implemented to form a contact hole 410 by exposing source/drain region 312 on the surface of the semiconductor substrate 300. This is implemented during a given time period which is a slight over etching condition.

Next, a conductive material is deposited onto the semiconductor substrate 300 on which the dielectric interlayer pattern 392 including the contact hole 410 is formed, to thereby form a contact or a storage electrode (not shown).

After implementing the first etching by determining the first EPD using the emission spectrum of the CN compound produced during the etching, the following method can be alternatively applied for the second etching to expose the surface of the semiconductor substrate.

FIGS. 5A through 5E are cross-sectional views for explaining a method of manufacturing a contact hole according to another embodiment of the present invention.

The end point of the second etching can be determined by detecting an emitting amount of a compound produced through a reaction of the etching gas with a component from a stopping layer formed on the semiconductor substrate. The stopping layer can be formed from, for example, of SiN. The stopping layer is formed on the semiconductor substrate before the manufacture of the contact hole. In this case, the emission amount of the CN compound generated from the stopping layer is detected to end the etching of the dielectric interlayer, and then, the stopping layer is etched by applying an etching condition appropriate for the stopping layer. This method will be explained more particularly with reference to FIGS. 5A through 5E.

Figure 5A:
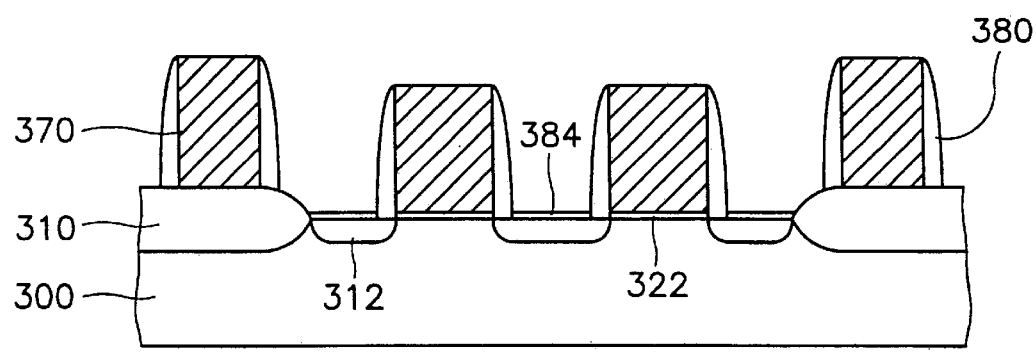

Referring to FIG. 5A, a gate electrode 370 is formed on a semiconductor substrate 300 which is divided into an active region and a field region by a field oxide layer 310 having a thickness of about 1800–2000 Å. A second insulating layer (not shown) is formed by depositing silicon nitride to a thickness of about 1200 Å on the semiconductor substrate 300 on which the gate electrode 370 is formed. Then, the second insulating layer is etched back until the active region of the semiconductor substrate 300 is exposed to form a spacer 380 on the side portion of the gate electrode 370.

Next, an ion implantation process is implemented to inject impurities into the exposed active region of the semiconductor substrate 300 to form a diffusion region 312 of a source/drain region of a transistor. On the exposed portion of the semiconductor substrate 300, silicon nitride (SiN) is deposited to a thickness of about 100–120 Å to form an SiN layer 384. The SiN layer can be applied for preventing an oxidation of the substrate during a reflow process of the subsequently applied dielectric interlayer layer, such as a BPSG layer. In the present invention, the SiN layer is applied as a stopping layer for determining the end point of the etching for forming a contact hole. On the exposed portion of the substrate on which the gate electrode and the spacer are formed, a thermal oxide layer (not shown) having a thickness of about 100 Å is formed. This layer prevents damage to the impurity-doped region during the deposition of SiN.

Figure 5B:
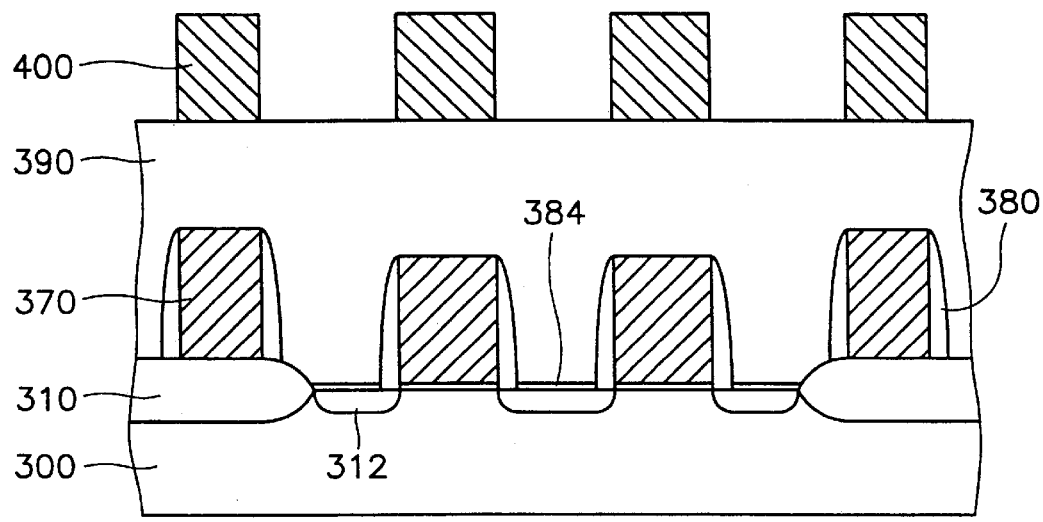

Referring to FIG. 5B, a dielectric interlayer 390 is formed on the semiconductor substrate 300 on which the gate electrode 370, the spacer 380 and the SiN layer 384 are formed. The dielectric interlayer 390 is formed by depositing silicon oxide, BPSG, PSG, etc. to a thickness of about 3000–10000 Å using a low pressure chemical vapor deposition method or a plasma enhanced chemical vapor deposition method. Next, the surface portion of the dielectric interlayer 390 is planarized using a CMP method. Subsequently, a photoresist pattern 400 for exposing a to-be-formed contact hole portion, is formed by depositing photoresist on the dielectric interlayer 390 and then patterning the photoresist by photolithography.

Figure 5C:
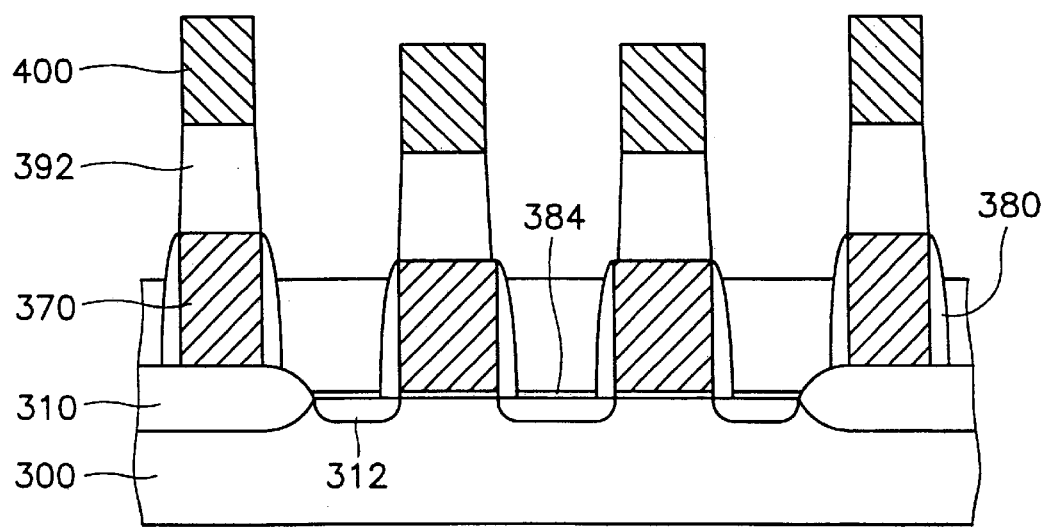

Referring to FIG. 5C, the dielectric interlayer 390 is etched by utilizing the photoresist pattern 400 as an etching mask. The etching of the dielectric interlayer layer is implemented by utilizing an etching equipment having a high ionization degree such as ICP, TCP, SWP, DRM, etc. and by utilizing a mixture gas having a high ratio of carbon/fluorine such as C3F8, C4F8, C5F8, CO, etc.

During etching, the emission amount of CN compounds is continuously monitored as illustrated in FIG. 3 to determine detect when the emission amount reaches the apex point represented as "a". This point occurs immediately after the spacer is exposed as illustrated in FIG. 5C.

Referring to FIG. 5D, the second etching is implemented to expose a source/drain region 112 of the semiconductor substrate 300 to form a contact hole 410. At this time, the second EPD is fixed to a point when the SiN layer 384 is exposed and the etching is ended after implementing over etching for a period of time. The second EPD corresponds to the second apex "b" illustrated in FIG. 3.

The determination of the first end point of the etching by utilizing the first apex obtained by the etching of the spacer can be omitted. At this time, the end point of the whole etching can be determined by utilizing the second apex obtained by the etching of the SiN stopping layer. However, practically, the emission intensity of the second apex is not high enough and so it is safer that the end point of the etching is determined on a step by step basis using the first and the second end points as describe above.

After that, the SiN stopping layer is etched by using a gas such as $CHF_3$, $O_2$, He, etc. to complete the manufacture of the contact hole according to the present invention.

It is noted that in some instances the second CN peak which represents the end point of the etching for the formation of the contact hole may not be detected within a given time period due to equipment problems. As such, when the second peak is not detected within the estimated time or when a defect is generated, the equipment is interlocked to hold the operation of the equipment. Then, the substrate is examined to determine a degree of an over etch or an under etch.

In addition, since the second CN peak sometimes has a low emission intensity, this peak may be difficult to reproduce. As such, the emission intensity of the CO compound produced during the etching of the dielectric interlayer can be utilized in determining the end point of the etching. That is, since the emission intensity of the CO compound reduces after the exposure of the substrate, the point where the emission intensity of the CO compound reduces and the point where the emission intensity of the CN compound increases may be compared to determine the end point of the etching.

As described above, the first end point of the etching can be advantageously determined during a dry etching process of a semiconductor device according to the present invention. Accordingly, the control of the etching process for the manufacture of the contact hole is advantageous and an optimized condition according to the thickness of a target layer to be etched can be applied. Defects caused by a contact hole which is not opened and damage resulting from over etching can be minimized.

While the present invention is described in detail referring to the attached embodiments, various modifications, alternate constructions and equivalents may be employed without departing from the true spirit and scope of the present invention.

Also, it is noted that this is a counterpart of, and claims priority to, Korean Patent Application No. 2000-43762, filed Jul. 28, 2000, the entire contents of which are incorporated herein by reference.

What is claimed is:

1. A method of manufacturing a contact hole of a semiconductor device, comprising:

forming a spacer on a side wall of a gate electrode formed over a substrate, wherein an active region of a surface of the substrate is exposed adjacent the spacer;

forming a dielectric interlayer over the active region of the substrate, the gate electrode and the spacer;

masking a region of the dielectric interlayer aligned over the gate electrode, and subjecting a remaining region of the dielectric interlayer aligned over the active region of the substrate to a first etching process using an etching gas to partially form a contact hole in the dielectric interlayer;

detecting when an emission amount of a chemical compound emitted during the first etching process has reached a maximum emission intensity, wherein the chemical compound is produced by a chemical combination of the etching gas and the spacer; and subjecting the remaining region of the dielectric interlayer to a second etching process to further form the contact hole in the dielectric interlayer upon detecting that the emission amount of the chemical compound has reached maximum emission intensity.

2. The method as claimed in claim 1, further comprising detecting when the emission amount of the chemical compound during the second etching process has reached a second emission intensity, and terminating the second etching process upon detecting that the amount of the chemical compound during the second etching process has reached the second emission intensity.

3. The method as claimed in claim 1, wherein the dielectric interlayer is comprised of an oxide compound and the spacer is comprised of a nitride compound.

4. The method as claimed in claim 1, wherein the dielectric interlayer is comprised of BPSG (borophosphorus silicate glass) and the spacer is comprised of silicon nitride.

5. The method as claimed in claim 1, wherein the etching gas is at least one selected from the group consisting of $C_3F_8$, $C_4F_8$, $C_5F_8$ and CO.

6. The method as claimed in claim 1, wherein the etching gas and the spacer react to produce the chemical compound having a C—N bond.

7. A method of manufacturing a contact hole of a semiconductor device, comprising:

forming a spacer on a side wall of a gate electrode formed over a substrate, wherein an active region of a surface of the substrate is exposed adjacent the spacer;

forming a stopper layer on the exposed active region of the surface of the substrate;

forming a dielectric interlayer over the gate electrode, the stopper layer and the spacer;

masking a region of the dielectric interlayer aligned over the gate electrode, and subjecting a remaining region of the dielectric interlayer aligned over the active region of the substrate to a first etching process using an etching gas to partially form a contact hole in the dielectric interlayer;

detecting when an emission amount of a chemical compound emitted during the first etching process has reached a maximum emission intensity, wherein the chemical compound is produced by a chemical combination of the etching gas and the spacer; and subjecting the remaining region of the dielectric interlayer to a second etching process to further form the contact hole in the dielectric interlayer upon detecting that the emission amount of the chemical compound has reached the maximum emission intensity.

8. The method as claimed in claim 7, wherein the dielectric interlayer is comprised of an oxide compound, and the spacer and the stopper layer are comprised of a nitride compound.

9. The method as claimed in claim 7, wherein the dielectric interlayer is comprised of BPSG (borophosphorous silicate glass), and the spacer and the stopper layer are comprised of silicon nitride.

10. The method as claimed in claim 7, wherein said etching gas is at least one selected from the group consisting of $C_3F_8$, $C_4F_8$, $C_5F_8$ and CO.

11. The method as claimed in claim 7, further comprising detecting when the emission amount of a second chemical compound during the second etching process has reached a second emission intensity, wherein the second chemical compound is produced by a chemical reaction of the etching gas and the stopper layer, and terminating the second etching process upon detecting that the amount of the second chemical compound during the second etching process has reached a second emission intensity.

12. The method as claimed in claim 11, further comprising removing the stopper layer after terminating the second etching process.

13. The method as claimed in claim 12, wherein the chemical compound and the second chemical compound are the same.

* * * * *